US010292307B1

(12) United States Patent
Wyland

(10) Patent No.: US 10,292,307 B1
(45) Date of Patent: May 14, 2019

(54) THERMAL HEATSINK

(71) Applicant: Juniper Networks, Inc., Sunnyvale, CA (US)

(72) Inventor: Christopher Paul Wyland, Livermore, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/862,087

(22) Filed: Jan. 4, 2018

(51) Int. Cl.
*H05K 7/20* (2006.01)
*F28F 13/00* (2006.01)

(52) U.S. Cl.
CPC ......... *H05K 7/20218* (2013.01); *F28F 13/00* (2013.01); *H05K 7/2039* (2013.01); *F28F 2013/008* (2013.01)

(58) Field of Classification Search
CPC ... H05K 7/20218; H05K 7/2039; F28F 13/00; F28F 2013/008
USPC ........................................................ 361/699
See application file for complete search history.

(56) References Cited

U.S. PATENT DOCUMENTS

| | | | | |
|---|---|---|---|---|
| 3,957,107 A | * | 5/1976 | Altoz | F28D 15/06 165/276 |
| 4,323,914 A | * | 4/1982 | Berndlmaier | H01L 23/057 257/697 |
| 6,948,864 B2 | | 9/2005 | Reilly et al. | |
| 2008/0191729 A1 | * | 8/2008 | Blanco | G01R 31/2874 324/750.08 |
| 2017/0148704 A1 | | 5/2017 | Matsumoto et al. | |
| 2017/0148745 A1 | | 5/2017 | Matsumoto et al. | |
| 2017/0321966 A1 | * | 11/2017 | Lueckenbach | F28D 15/0233 |
| 2018/0095481 A1 | * | 4/2018 | Swint | G05D 23/01 |

OTHER PUBLICATIONS

Sen, Prosenjit, et al., "Microscale Liquid-Metal Switches—A Review", IEEE Transactions on Industrial Electronics, vol. 56, No. 4, (Apr. 2009), 1314-1330.

* cited by examiner

Primary Examiner — Mukundbhai G Patel
(74) Attorney, Agent, or Firm — Schwegman Lundberg & Woessner, P.A.

(57) ABSTRACT

An example heatsink is operable as a multimode thermal switching heatsink and includes a housing that has a first heat transfer coefficient. The housing has a first heat transfer coefficient. The heatsink further includes a liquid in thermal communication with the housing and operatively positioned adjacent to a heat source. The liquid has a second heat transfer coefficient, which may be greater than the first heat transfer coefficient. In a first operating condition, the liquid has a first volume at a first thermal contact with the heat source, and, in a second operating condition, the liquid has a second volume and a second thermal contact with the heat source. The second thermal contact is greater than the first thermal contact, thereby enhancing dissipation of heat from the heat source in the second operating condition.

20 Claims, 8 Drawing Sheets

THERMAL HEATSINK

TECHNICAL FIELD

The subject matter disclosed herein generally relates to the technical field of heatsinks and to the technologies by which such heatsinks become improved compared to other heatsinks. Specifically, the present disclosure addresses a thermal heatsink.

BACKGROUND

A heatsink is made of one solid material that has one heat transfer coefficient. Accordingly, as typically manufactured, configured, or otherwise adapted, the heatsink has one overall thermal conductivity, which may depend, at least in part, on the heat transfer coefficient, the shape of the heatsink, or both. Thus, when the heatsink is affixed or otherwise placed in thermal communication with a heat source, the heatsink transfers heat energy away from the heat source with its single overall thermal conductivity, in accordance with the single heat transfer coefficient of the single solid material.

BRIEF DESCRIPTION OF THE DRAWINGS

Some embodiments are illustrated by way of example and not limitation in the figures of the accompanying drawings.

DETAILED DESCRIPTION

A heatsink is or includes a thermal heatsink (e.g., a thermal switching heatsink), which may take the example form of a multimode thermal switching heatsink having at least two modes, each with its own distinct overall thermal conductivity. For example, the heatsink may be a dual-mode thermal switching heatsink that has one (e.g., relatively low) thermal conductivity at one (e.g., relatively low) temperature and a different (e.g., relatively high) thermal conductivity at a different (e.g., relatively high) temperature. Such a heatsink may function as a thermal switch that conducts heat energy with one (e.g., relatively low) efficiency at one (e.g., relatively low) temperature and a different (e.g., relatively high) efficiency at a different (e.g., relatively high) temperature. This multi-mode (e.g., dual-mode) characteristic can be useful in situations where the heatsink operates within a relatively wide range of temperatures, such as cooling an integrated circuit. Moreover, this multi-mode characteristic enables such a heatsink to be a cost-effective substitute for expensive thermoelectric coolers, heat pipes, or other fluid cooling mechanisms.

Example hardware discussed herein are manufactured, configured, or otherwise adapted to facilitate heat transfer. Such example hardware includes components (e.g., a heatsink, a thermal switch, or any suitable combination thereof), assemblies (e.g., a circuit assembly), and machines (e.g., a device that includes one or more of such components or assemblies). Examples merely typify possible variations. Unless explicitly stated otherwise, structures (e.g., structural components, such as solid housings or drops of liquid metal) are optional and may be combined or subdivided, and operations (e.g., in a procedure, algorithm, or other function) may vary in sequence or be combined or subdivided. In the following description, for purposes of explanation, numerous specific details are set forth to provide a thorough understanding of various example embodiments. It will be evident to one skilled in the art, however, that the present subject matter may be practiced without these specific details.

Figure 1A:
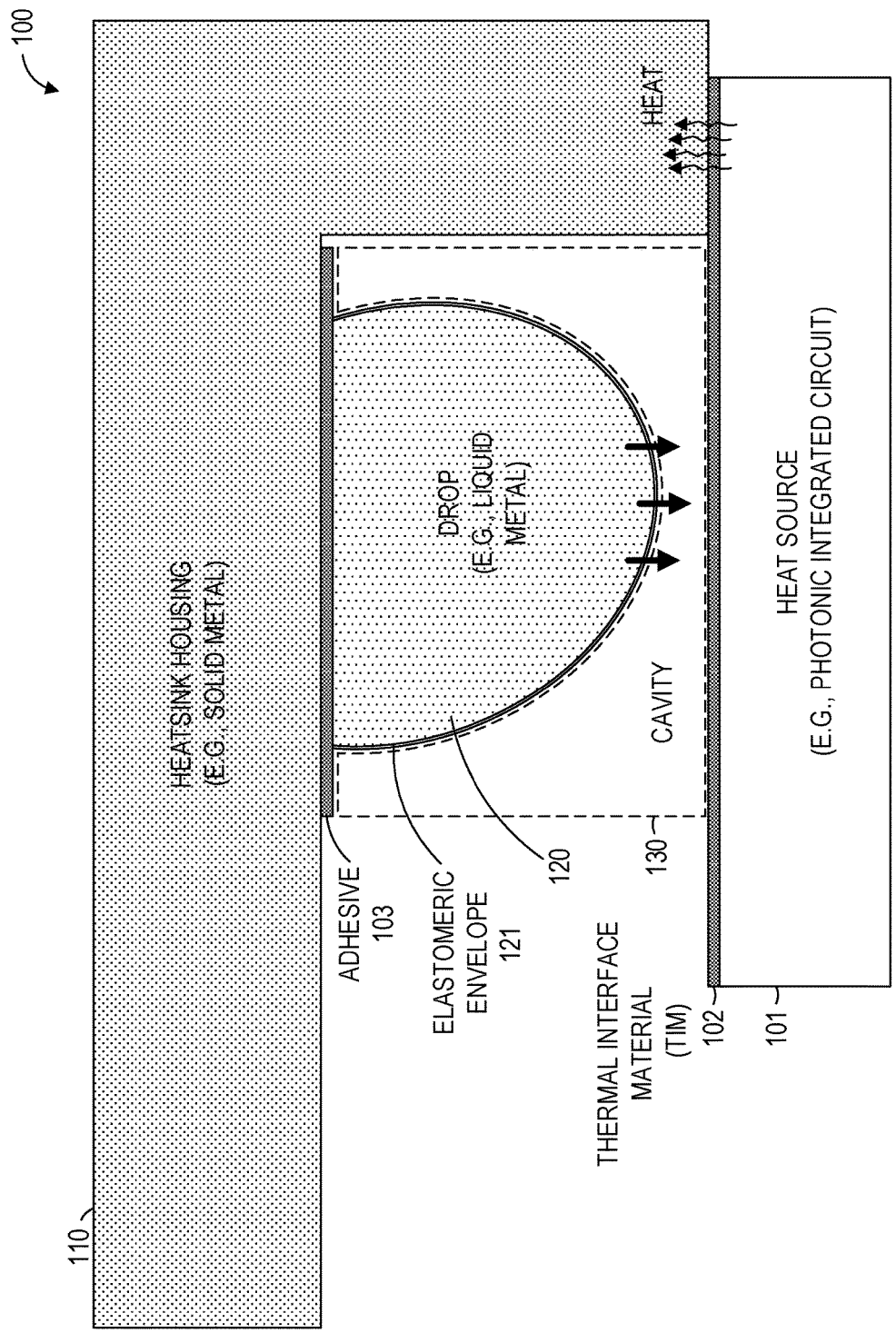
FIG. 1A is a cross-sectional diagram illustrating a heatsink, according to a first example embodiment, in a first operating condition.

FIG. 1A is a cross-sectional diagram illustrating a heatsink 100, according to a first example embodiment, in a first operating condition. The heatsink 100 is an example of a multimode thermal switching heatsink, thermal switch, or both, and includes a heatsink housing 110 that has a first heat transfer coefficient. The heatsink housing 110 is made of solid material, such as a solid metal (e.g., an aluminum alloy). The heatsink housing 110 at least partially encloses a cavity 130, which may be considered as an expansion cavity (e.g., expansion receptacle).

The heatsink 100 also includes a drop 120 of liquid in thermal communication with the heatsink housing 110. The drop 120 is made of liquid material, such as a liquid metal (e.g., gallium or galinstan). As used herein, the term "drop" refers to a contiguous body of liquid of any suitable quantity. The drop 120 is manufactured, configured, or otherwise adapted to be adjacent to the cavity 130 when the drop 120 is at a first temperature (e.g., a relatively low temperature within a range of operating temperatures). This may be considered as a first condition of the drop 120 or a first state of the drop 120, corresponding to a first operating condition of the heatsink 100. Furthermore, the drop 120 has a second heat transfer coefficient that may be the same as or distinct from (e.g., higher than) the first heat transfer coefficient of the heatsink housing 110.

As shown in FIG. 1A, a layer of adhesive 103 may affix the drop 120 to the heatsink housing 110 or otherwise place the drop 120 in thermal communication with the heatsink housing 110. Also, the drop 120 may be contained within an elastomeric envelope 121, which may function as a stretchable or otherwise flexible container (e.g., analogous to a balloon) for the drop 120. In addition, the heatsink housing 110 may be affixed to a heat source 101 (e.g., a hardware processor or other integrated circuit, such as a photonic integrated circuit) or otherwise placed in thermal communication with the heat source 101 (e.g., to remove heat energy therefrom). As shown in FIG. 1A, a layer of thermal interface material 102 may be applied between the heat source 101 and the heatsink housing 110 (e.g., to improve thermal communication).

Figure 1B:
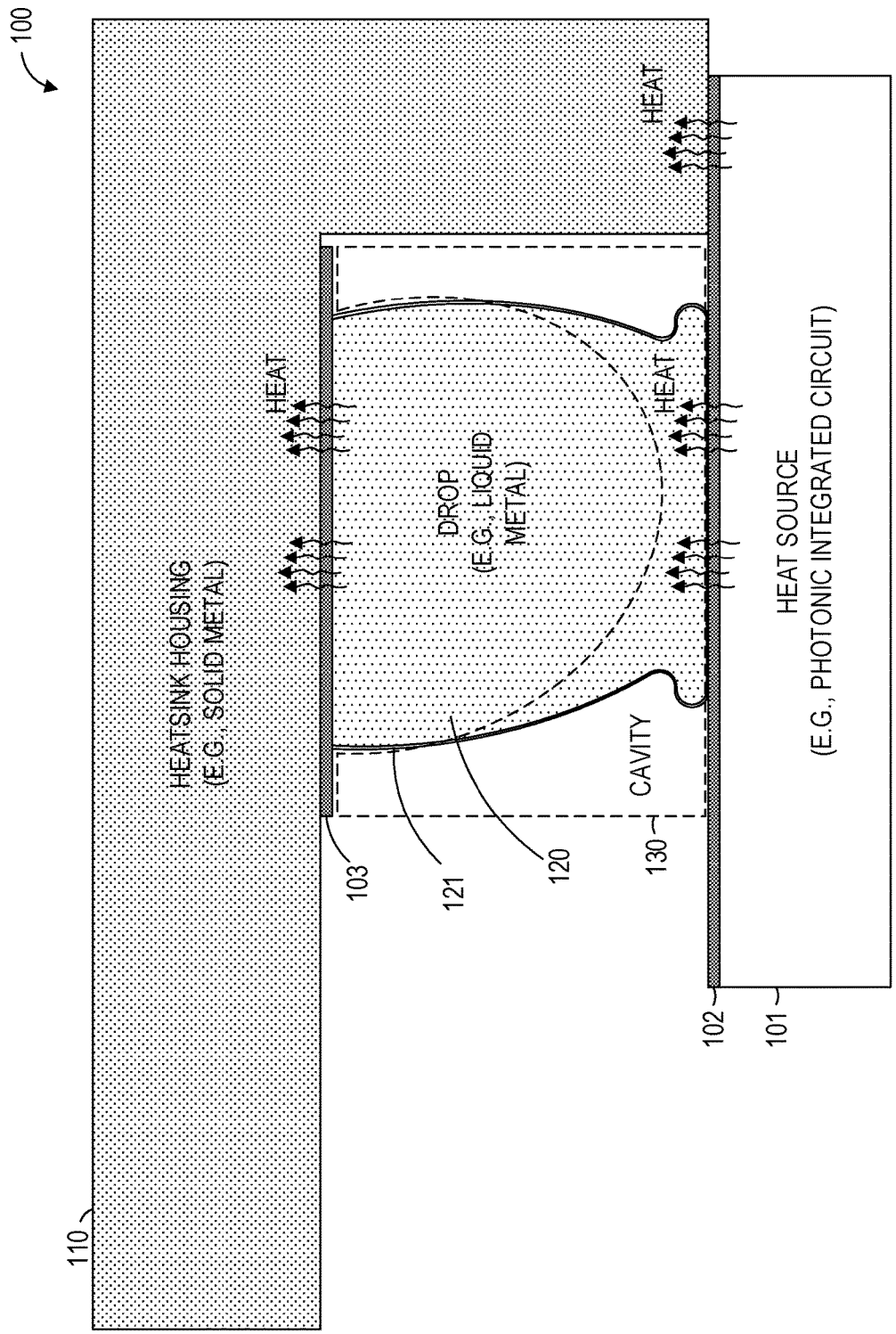
FIG. 1B is a cross-sectional diagram illustrating the heatsink, according to the first example embodiment, in a second operating condition.

The drop 120 is thermally deformable between a first shape (e.g., a contracted or non-extended shape) that does not extend into the cavity 130 at the first temperature and a second shape (e.g., an expanded or extended shape) that extends into the cavity 130 at a second temperature (e.g., relatively high temperature within the range of operating temperatures). Accordingly, when the drop 120 is at the first temperature and has the first shape, the drop 120 is in a first condition, and the heatsink 100 has a first overall thermal conductivity, which may be a relatively low thermal conductivity within a range of thermal conductivities. However, when the drop 120 is at the second temperature and has the second shape, the drop 120 is in a second condition, and the heatsink 100 has a second overall thermal conductivity, which may be a relatively high thermal conductivity within the range of thermal conductivities. This may be considered as a second condition of the drop 124 a second state of the drop 120, corresponding to a second operating condition of the heatsink 100. FIG. 1B is a cross-sectional diagram illustrating the heatsink 100, according to the first example embodiment, in the second operating condition.

Accordingly, supposing that the second temperature is higher than the first temperature, as the heatsink housing 110 increases in temperature from the first temperature to the second temperature, it warms the drop 120, which causes the drop 120 to thermally expand beyond its first shape and extend into the cavity 130. As the drop 120 (e.g., with or without the elastomeric envelope 121) attains its second shape from thermal expansion, it enhances the thermal conductivity of the heatsink 100 by coming into contact with the heat source 101, the thermal interface material 102, or any suitable combination thereof. The drop 120 thus contributes to the heatsink 100 an additional incremental capability for removing heat from the heat source 101. In other words, by thermally deforming from its first shape to its second shape, the drop 120 changes the overall thermal conductivity of the heatsink 100 from its first overall thermal conductivity to its second overall thermal conductivity.

Continuing to suppose that the second temperature is higher than the first temperature, the reverse occurs as the heatsink housing 110 decreases in temperature from the second temperature to the first temperature. As the drop 120 (e.g., with or without the elastomeric envelope 121) cools from its second shape to its first shape, the drop 120 thermally contracts such that it no longer contacts that heat source 101 or the thermal interface material 102. This causes the heatsink 100 to return to its first overall thermal conductivity.

Thus, the heatsink 100 can operate in at least two distinct modes that respectively correspond to two distinct temperature conditions, namely, a relatively low temperature condition (e.g., "cold" condition) in which the heatsink 100 provides slow or low thermal conduction of heat energy away from the heat source 101 and a relatively high temperature condition (e.g., "hot" condition) in which the heatsink 100 provides fast or high thermal conduction of heat energy away from the heat source 101. As shown in FIG. 1A, the relatively low temperature condition causes the heat energy to take a relatively longer or otherwise thermally resistive path through the heatsink housing 110, and as shown in FIG. 1B, the relatively high temperature condition allows the heat energy to take a relatively shorter or otherwise thermally less resistive path through the drop 120, with or without also going through the heatsink housing 110.

As can be envisioned from sequentially viewing FIG. 1A and FIG. 1B, if the drop 120 (e.g., with or without the elastomeric envelope 121) expands downward into the cavity 130 and contacts the heat source 101 (e.g., with or without the thermal interface material 102), the area of contact is increased between the heat source 101 and the heatsink 100. Consequently, more heat flows between the heat source 101 and the heatsink 100, and the heatsink 100 operates in a high thermal conduction mode. Similarly, as can be envisioned from sequentially viewing FIG. 1B and FIG. 1A, if the drop 120 later contracts upward out of the cavity 130 and ceases to contact the heat source 101, the area of contact is decreased between the heat source 101 and the heatsink 100. As a result, less heat flows between the heat source 101 and the heatsink 100, and the heatsink 100 operates in a low thermal conduction mode.

Figure 2:
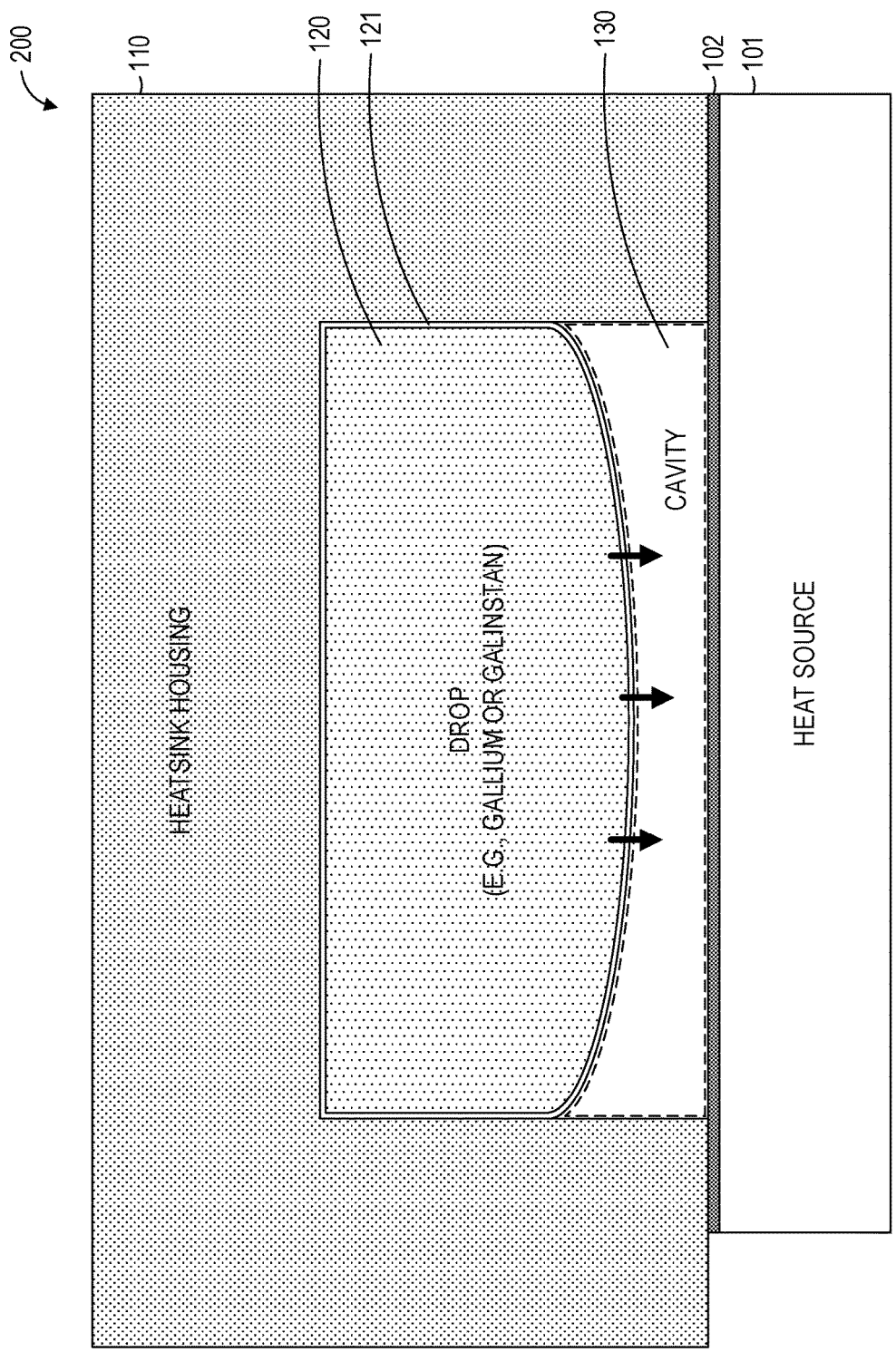
FIG. 2 is a cross-sectional diagram illustrating a heatsink, according to a second example embodiment.

As shown in FIG. 2, a heatsink 200 operates on principles similar to those described above with respect to FIG. 1A and FIG. 1B. Accordingly, the heatsink 200 is an example of a multimode thermal switching heatsink, a thermal switch, or both. However, in FIG. 2, the cavity 130, the drop 120, and the elastomeric envelope 121, if present, each have the corresponding cross-sectional shapes illustrated.

Accordingly, as can be envisioned from viewing FIG. 2, if the drop 120 (e.g., with or without the elastomeric envelope 121) expands downward into the cavity 130 and contacts the heat source 101 (e.g., with or without the thermal interface material 102), the area of contact between the heat source 101 and the heatsink 100 is increased. As a consequence, more heat flows from the heat source 101 to the heatsink 100, and the heatsink 100 overall operates in its high thermal conduction mode. Likewise, if the drop 120 later contracts (e.g., retracts) upward out of the cavity 130 and no longer contacts the heat source 101, the area of contact between the heat source 101 and the heatsink 100 is decreased. As a result, less heat flows from the heat source 101 to the heatsink 100, and the heatsink 100 overall operates in its low thermal conduction mode.

Figure 3:
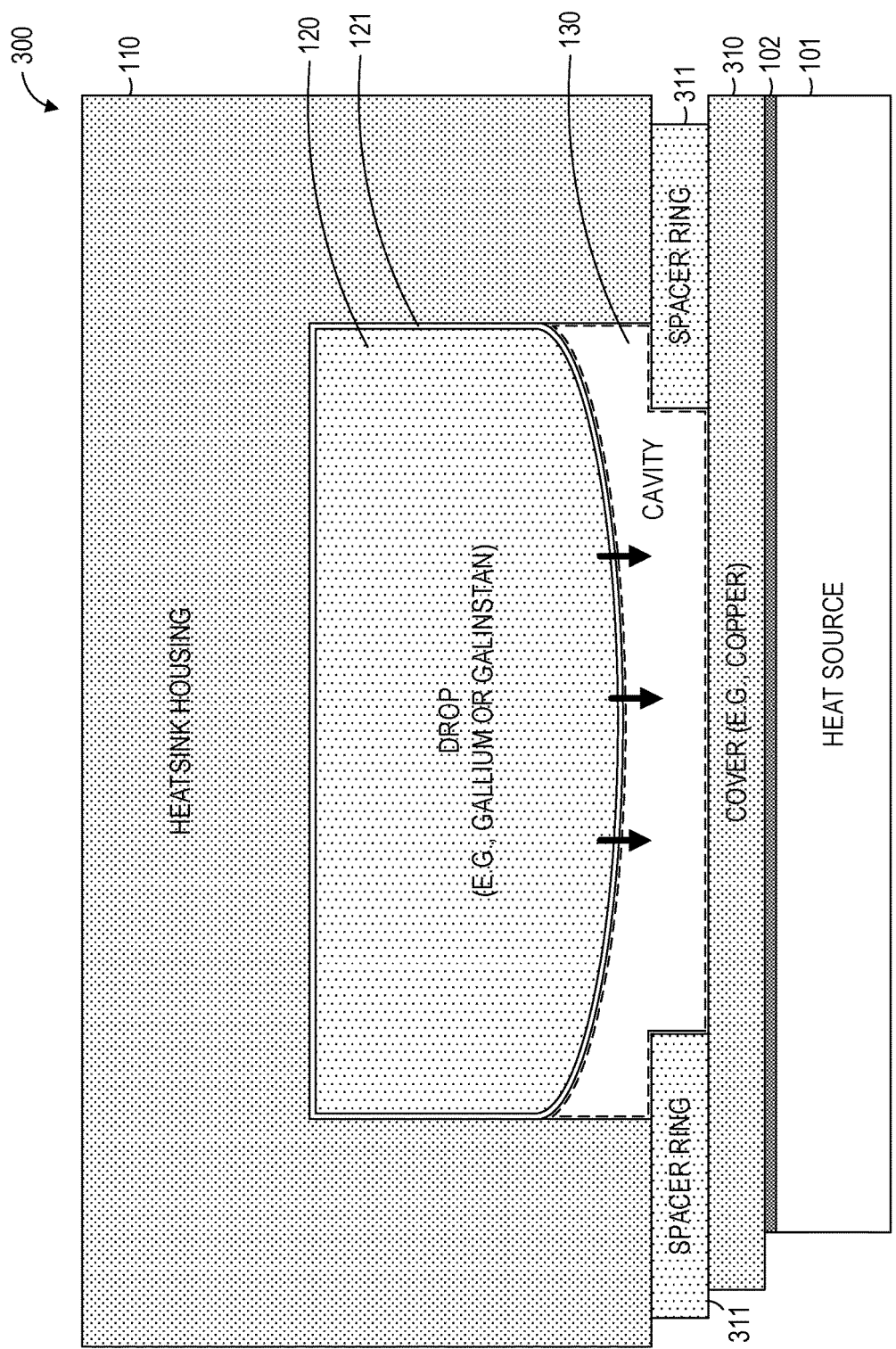
FIG. 3 is a cross-sectional diagram illustrating a heatsink, according to a third example embodiment.

As shown in FIG. 3, a heatsink 300 operates on principles similar to those described above with respect to FIGS. 1A, 1B, and 2. Accordingly, the heatsink 300 is an example of a multimode thermal switching heatsink, a thermal switch, or both. However, in FIG. 3, a cover 310 and a spacer ring 311 are disposed (e.g., a fixed or otherwise positioned) between the heat source 101 (e.g., with or without the thermal interface material 102) and the heatsink 100 (e.g., the heatsink housing 110). The cover 310, the spacer ring 311, or both, may be made out of any suitable thermally conductive material (e.g., copper), and one or both of them may be disposed as illustrated in FIG. 3 for the purpose of controlling tolerances (e.g., during manufacturing or assembly of a circuit assembly that includes the heatsink 100).

Figure 4:
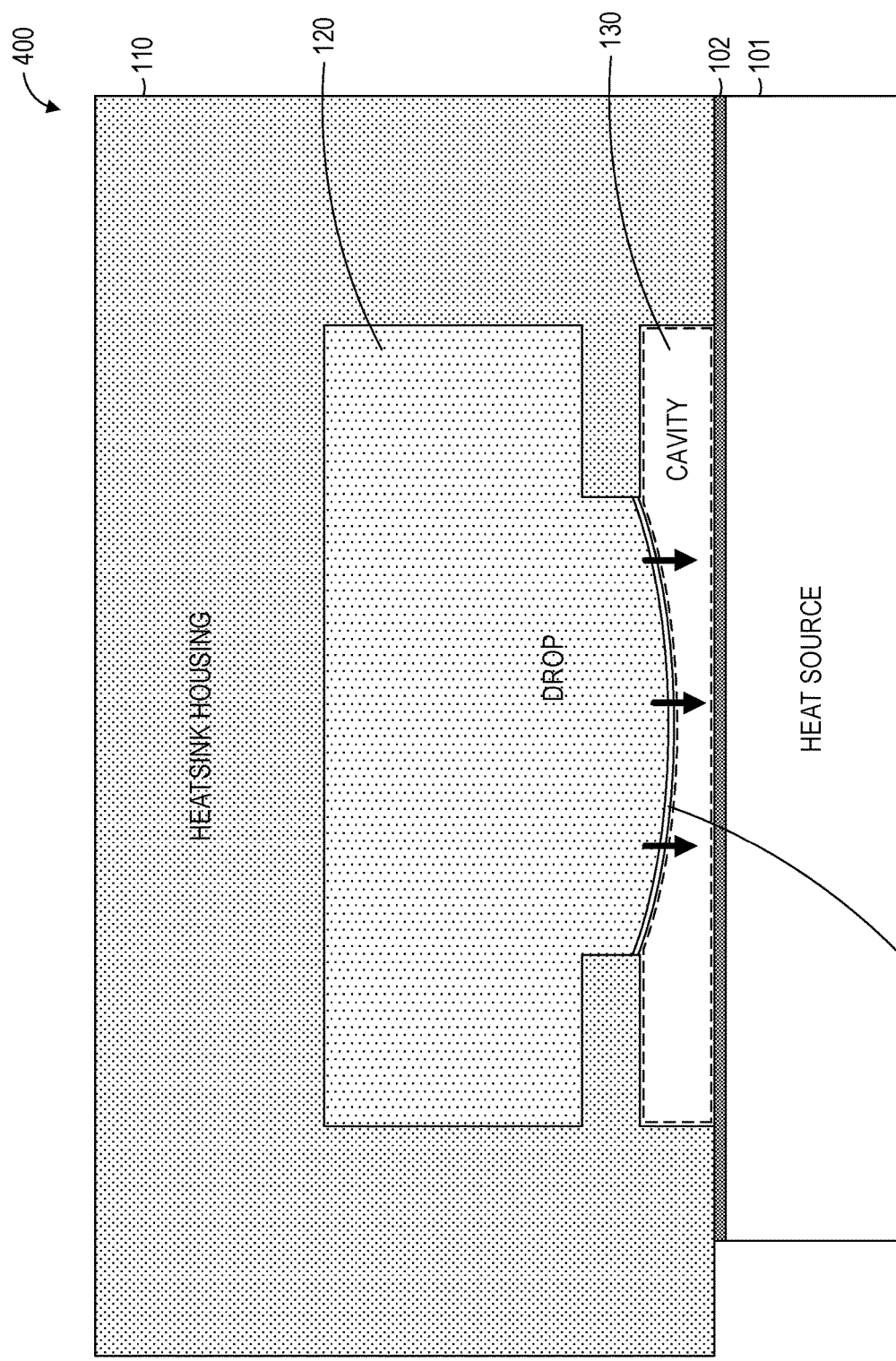
FIG. 4 is a cross-sectional diagram illustrating a heatsink, according to a fourth example embodiment.

As shown in FIG. 4, a heatsink 400 operates on principles similar to those described above with respect to FIGS. 1A, 1B, 2, and 3. Accordingly, the heatsink 400 is an example of a multimode thermal switching heatsink, a thermal switch, or both. However, in FIG. 4, the heatsink housing 110, the drop 120, the cavity 130, and the elastomeric envelope 121, if present, respectively each have the corresponding cross-sectional shapes illustrated.

Accordingly, as can be envisioned from viewing FIG. 4, if the drop 120 (e.g., with or without the elastomeric envelope 121) expands downward into the cavity 130 and contacts the heat source 101 (e.g., with or without the thermal interface material 102), the area of contact between the heat source 101 and the heatsink 100 is increased. Consequently, more heat flows from the heat source 101 to the heatsink 100, and the heatsink 100 overall operates in its high thermal conduction mode. Similarly, if the drop 120 later contracts (e.g., retracts) upward out of the cavity 130 and no longer contacts the heat source 101, the area of contact between the heat source 101 and the heatsink 100 is decreased. As a result, less heat flows from the heat source 101 to the heatsink 100, and the heatsink 100 overall operates in its low thermal conduction mode.

Figure 5:
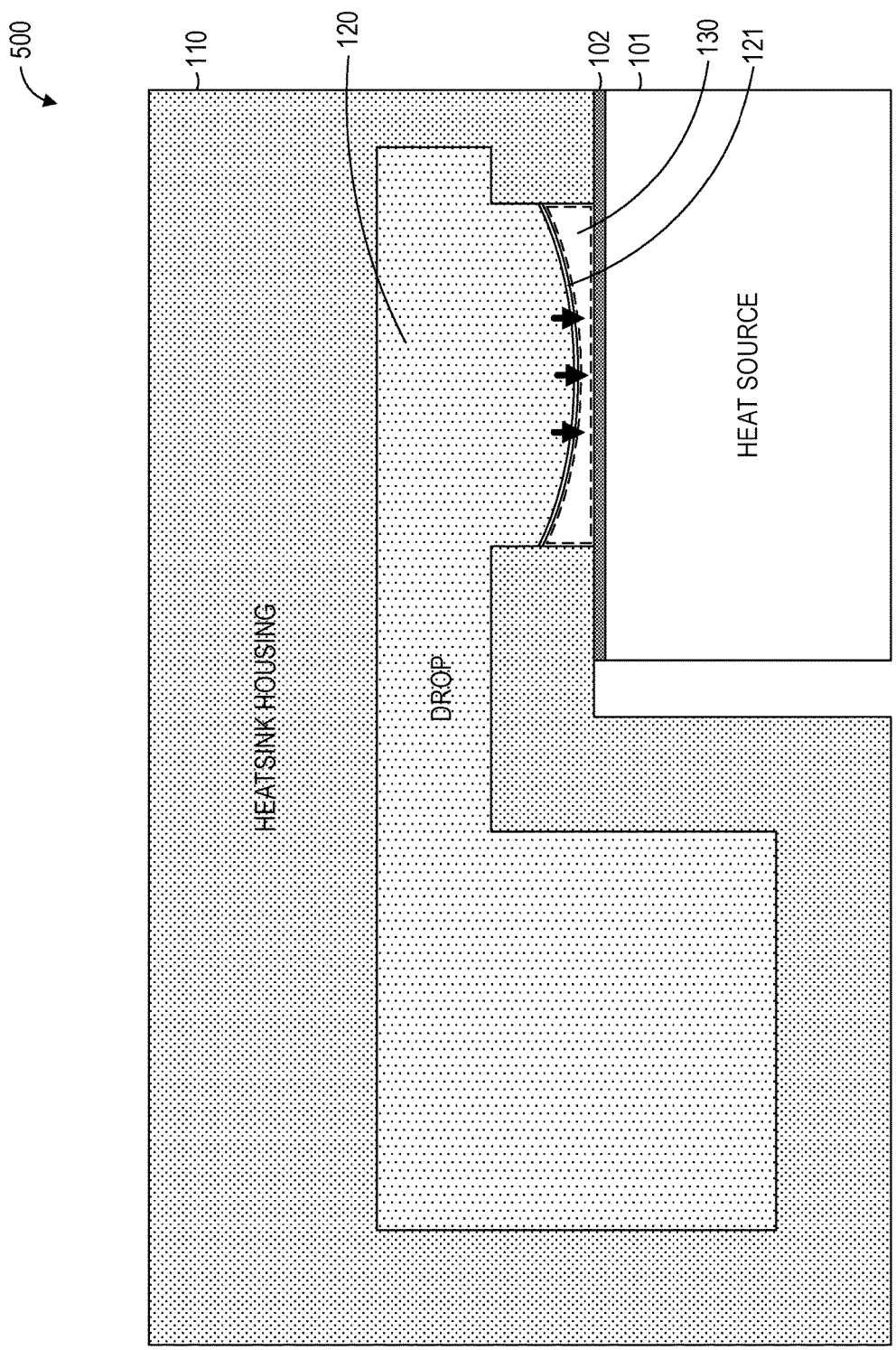
FIG. 5 is a cross-sectional diagram illustrating a heatsink, according to a fifth example embodiment.

As shown in FIG. 5, a heatsink 500 operates on principles similar to those described above with respect to FIGS. 1A, 1B, 2, 3, and 4. Accordingly, the heatsink 500 is an example of a multimode thermal switching heatsink, a thermal switch, or both. However, in FIG. 5, the heatsink housing 110, the drop 120, the cavity 130, and elastomeric envelope 121, if present, respectively each have their corresponding cross-sectional shapes illustrated. In the example embodiments depicted in FIG. 5, the heatsink housing 110 includes a reservoir that contains a substantial (e.g., majority) portion of the drop 120. This may have the effect of facilitating thermal communication between the drop 120 and the heatsink housing 110, such that the drop 120 more efficiently follows the temperature of the heatsink housing 110 (e.g., in being warmed or cooled by the heatsink housing 110).

Accordingly, as can be envisioned from viewing FIG. 5, if the drop 120 (e.g., with or without the elastomeric envelope 121) bulges outward into the cavity 130 and contacts the heat source 101 (e.g., with or without the thermal interface material 102), the area of contact between the heat source 101 and the heatsink 100 is increased. As a consequence, more heat flows from the heat source 101 to the heatsink 100, and the heatsink 100 overall operates in its high thermal conduction mode. Likewise, if the drop 120 later contracts (e.g., withdraws) back out of the cavity 130 and no longer contacts the heat source 101, the area of contact between the heat source 101 and the heatsink 100 is decreased. As a result, less heat flows from the heat source 101 to the heatsink 100, and the heatsink 100 overall operates in its low thermal conduction mode.

Figure 6:
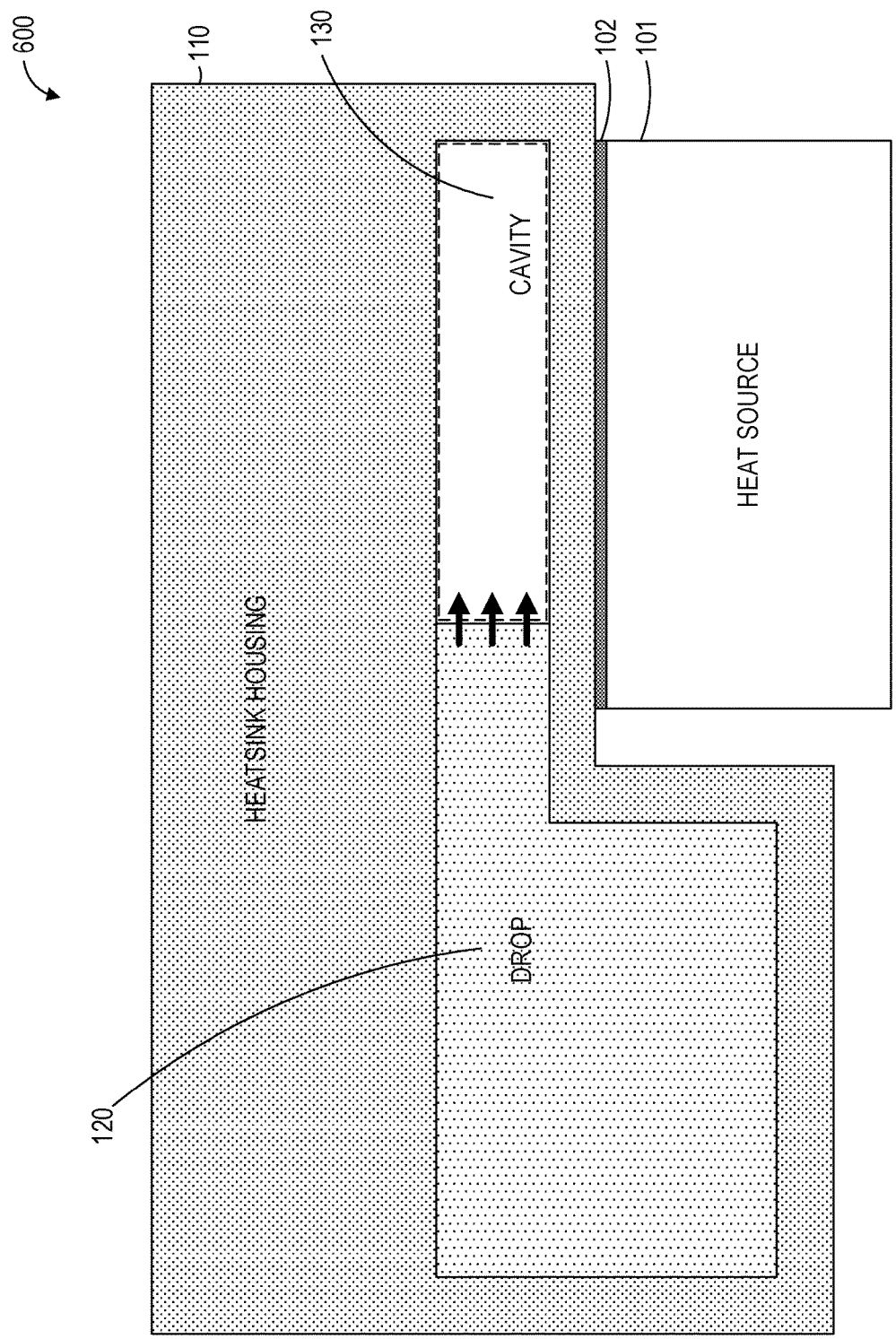
FIG. 6 is a cross-sectional diagram illustrating a heatsink, according to a sixth example embodiment.

As shown in FIG. 6, a heatsink 600 operates on principles similar to those described above with respect to FIGS. 1A, 1B, 2, 3, 4, and 5. Accordingly, the heatsink 600 is an example of a multimode thermal switching heatsink, a thermal switch, or both. However, in FIG. 6, the heatsink housing 110, the drop 120, and the cavity 130 respectively each have their corresponding cross-sectional shapes illustrated. There may be no elastomeric envelope 121. A reservoir in the heatsink housing 110 contains a substantial (e.g., majority) portion of the drop 120. In the example embodiments depicted in FIG. 6, the heatsink 100 completely contains the drop 120 and the cavity 130, and the drop 120 is configured or otherwise adapted to fully or partially fill the cavity 130 in a sideways direction (e.g., parallel to the upper surface of the heat source 101), as the drop 120 thermally deforms from its first shape at the first temperature to its second shape at the second temperature.

Accordingly, as can be envisioned from viewing FIG. 6, if the drop 120 is heated by the heatsink housing 110 and accordingly expands, the drop 120 expands and flows into the cavity 130. This expansion may result in rapid displacement of the drop 120 into the cavity 130, by virtue of the large portion (e.g., majority portion) of the drop 120 in the reservoir of the heatsink housing 110, in comparison to the relatively narrow shape of the cavity 130 illustrated in FIG. 6.

As the drop 120 fills the cavity 130 more and more, the drop 120 increases the amount of heat energy communicated across the cavity 130. The drop 120 thus contributes to the heatsink 100 additional incremental capability for removing heat from the heat source 101. As a result, the full or partial filling of the cavity 130 by the drop 120 changes the overall thermal conductivity of the heatsink 100 from its first overall thermal conductivity to its second overall thermal conductivity.

In addition, in various example embodiments of the heatsink 100, as illustrated in FIG. 6, the expansion of the drop 120 into the cavity 130 may be configured or otherwise adapted (e.g., finely tuned) to provide any one or more of several intermediate overall thermal conductivities to the heatsink 100. That is, by varying how much liquid material of the drop 120 is extending into the cavity 130, the overall thermal conductivity of the heatsink 100 may smoothly sweep through a range of thermal conductivities that lie between the first overall thermal conductivity at the first temperature and the second overall thermal conductivity at the second temperature. This multimodal effect may contrast with the example embodiments shown in FIGS. 1-5, in which the distinction between contact and non-contact between the drop 120 and the heat source 101 can result in more bimodal (e.g., binary) behavior.

Figure 7:
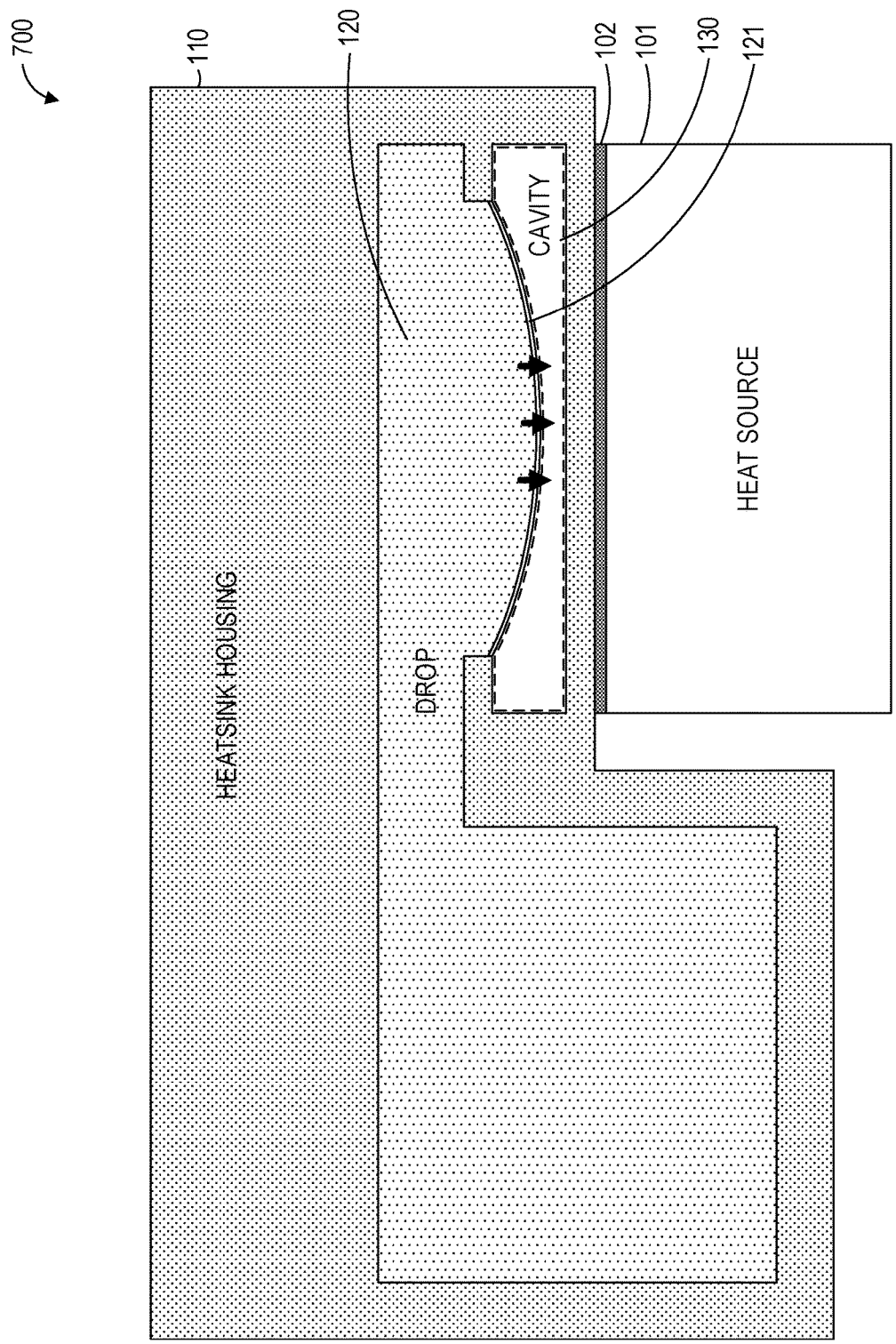
FIG. 7 is a cross-sectional diagram illustrating a heatsink, according to a seventh example embodiment.

As shown in FIG. 7, a heatsink 700 operates on principles similar to those described above with respect to FIGS. 1A, 1B, 2, 3, 4, 5, and 6. Accordingly, the heatsink 700 is an example of a multimode thermal switching heatsink, a thermal switch, or both. However, in FIG. 7, the heatsink housing 110, the drop 120, the cavity 130, and the elastomeric envelope 121, if present, respectively each have their corresponding cross-sectional shapes illustrated. In the example embodiments depicted in FIG. 7, the heatsink 100 completely contains the drop 120 in the cavity 130. In a manner similar to that described above with respect to FIG. 5, a reservoir in the heatsink housing 110 contains a substantial (e.g., majority) portion of the drop 120. However, in the example embodiments depicted in FIG. 7, the drop 120 (e.g., with or without the elastomeric envelope 121) is configured or otherwise adapted to fully or partially fill the cavity 130 by bulging in a downward direction (e.g., perpendicular to the upper surface of the heat source 101) toward the heat source 101 (e.g., with or without the thermal interface material 102), as the drop 120 thermally deforms from its first shape at the first temperature to its second shape that the second temperature.

Accordingly, as can be envisioned from viewing FIG. 7, if the drop 120 (e.g., with or without the elastomeric envelope 121) bulges downward into the cavity 130 and contacts the inner surface of the heatsink housing 110, the area of contact between the drop 120 and the inner surface of the heatsink housing 110 is increased. As the drop 120 fills the cavity 130 more and more, the drop 120 increases the amount of heat energy communicated through the cavity 130. Consequently, more heat flows from the heat source 101 to the heatsink 100, and the heatsink 100 overall operates in its high thermal conduction mode. The drop 120 thus contributes to the heatsink 100 additional incremental capability for removing heat from the heat source 101. As a result, the full or partial filling of the cavity 130 by the drop 120 changes the overall thermal conductivity of the heatsink 100 from its first overall thermal conductivity to its second overall thermal conductivity.

Similarly, if the drop 120 later contracts (e.g., withdraws) back out of the cavity 130 and no longer contacts the heat source 101, the area of contact between the heat source 101 and the heatsink 100 is decreased. As a result, less heat flows from the heat source 101 to the heatsink 100, and the heatsink 100 overall operates in its low thermal conduction mode.

As configured in accordance with FIG. 7, the heatsink 100 may be more resistant to variations in tolerances when being affixed or otherwise being placed in thermal communication with the heat source 101. By fully enclosing the drop 120 and the cavity 130 within the heatsink housing 110, the dimensions of both can be precisely controlled during manufacture and assembly of the heatsink 100.

According to various example embodiments, the heatsink 100 described herein may facilitate thermal communication, and in particular, multimode (e.g., dual-mode) thermal communication. Moreover, the heatsink 100 described herein may facilitate provision of a temperature-sensitive thermal switch that transfers heat energy with relatively low efficiency at one temperature and with relatively high efficiency at another temperature. Hence, the heatsink 100 described herein may facilitate cost-effective heat management (e.g., cooling, heating, or insulation) of a heat source (e.g., heat source 101, which may take the example form of a processor or other integrated circuit, such as a photonic integrated circuit), as well as cost-effective manufacture or assemblage of a circuit assembly that includes the heat source, compared to capabilities of pre-existing heatsinks.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and their functionality presented as separate components and functions in example configurations may be implemented as a combined structure or component with combined functions. Similarly, structures and functionality presented as a single component may be implemented as separate components and functions. These and other variations, modifications, additions, and improvements fall within the scope of the subject matter herein. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

The following enumerated embodiments describe various example embodiments of methods, machine-readable media, and systems (e.g., machines, devices, or other apparatus) discussed herein.

A first example embodiment provides a heatsink comprising:
a housing having a first heat transfer coefficient; and
a liquid in thermal communication with the housing and operatively positioned adjacent to a heat source and having a second heat transfer coefficient that is greater than the first heat transfer coefficient, wherein:
in a first operating condition, the liquid has a first volume at a first thermal contact with the heat source; and
in a second operating condition, the liquid has a second volume and a second thermal contact with the heat source, the second thermal contact being greater than the first thermal contact thereby enhancing dissipation of heat from the heat source in the second operating condition.

A second example embodiment provides a heatsink according to the example first embodiment, wherein the liquid comprises liquid metal.

A third example embodiment provides a heatsink according to the second example embodiment, wherein the liquid metal comprises at least one of liquid gallium or liquid galinstan.

A fourth example embodiment provides a heatsink according to any of the first through third example embodiments, further comprising an elastomeric membrane between the liquid and the heat source, the elastomeric membrane being adapted to resist expansion of the liquid toward the heat source.

A fifth example embodiment provides a heatsink according to any of the first through fourth example embodiments, wherein:

in the first operating condition, the liquid is at a first temperature and has a first shape that does not extend into a cavity at least partially bounded by the liquid and the heat source, the liquid making no fluid contact with the heat source; and
in the second operating condition, the liquid is at a second temperature, greater than the first temperature, and has a second shape that extends into the cavity, the liquid making contact with the heat source.

A sixth example embodiment provides a heatsink according to any of the first through fifth example embodiments, wherein the housing defines a cavity into which the liquid expands in the second operating condition.

A seventh example embodiment provides a heatsink according to the sixth example embodiment, wherein the cavity comprises air.

An eight example embodiment provides a heatsink according to the sixth example embodiment or the seventh example embodiment, wherein the liquid expands toward the heat source but does not make contact with the heat source.

A ninth example embodiment provides a heatsink according to the eighth example embodiment, further comprising an elastomeric membrane that defines a boundary of the cavity, the elastomeric membrane being adapted to prevent at least a portion of the liquid from contacting the heat source.

A tenth example embodiment provides a heatsink according to any of the first through fifth example embodiments, wherein:
the liquid, the housing, and the heat source define boundaries of a cavity;
the first operating condition corresponds to a first temperature at which the liquid has the first volume and has a first shape that does not extend into the cavity;
the second operating condition corresponds to a second temperature, greater than the first temperature, at which the liquid has the second volume and has a second shape that extends into the cavity.

An eleventh example embodiment provides a heatsink according to the tenth example embodiment, wherein the liquid is thermally expandable throughout a range of shapes that include the first and second shapes, the range of shapes further including an intermediate shape in which the liquid extends into the cavity to a lesser extent than in the second operating condition, the intermediate shape occurring at an intermediate temperature between the first and second temperatures.

A twelfth example embodiment provides a heatsink according to the tenth example embodiment or the eleventh example embodiment, wherein, in a third operating condition, the liquid has a third volume and a third thermal contact with the heat source, the third thermal contact being greater than the first thermal contact and less than the second thermal contact.

A thirteenth example embodiment provides a heatsink according to any of the tenth through twelfth example embodiments, wherein the housing defines a reservoir that contains a majority portion of the liquid in the first shape that does not extend into the cavity.

A fourteenth example embodiment provides a circuit assembly comprising:
an integrated circuit; and
a heatsink affixed to the integrated circuit, the heatsink comprising:
a housing having a first heat transfer coefficient; and a liquid in thermal communication with the housing and operatively positioned adjacent to the integrated circuit and having a second heat transfer coefficient that is greater than the first heat transfer coefficient, wherein:
in a first operating condition, the liquid has a first volume at a first thermal contact with the integrated circuit; and
in a second operating condition, the liquid has a second volume and a second thermal contact with the integrated circuit, the second thermal contact being greater than the first thermal contact thereby enhancing dissipation of heat from the integrated circuit in the second operating condition.

A fifteenth example embodiment provides a circuit assembly according to the fourteenth example embodiment, wherein the liquid has a first temperature in the first operating condition and the liquid has a second temperature in the second operating condition in which the liquid is in closer proximity to the integrated circuit to enhance the dissipation of heat by the heatsink in the second operating condition.

A sixteenth example embodiment provides a circuit assembly according to the fourteenth example embodiment or the fifteenth example embodiment, wherein the liquid comprises liquid metal.

A seventeenth example embodiment provides a circuit assembly according to the sixteenth example embodiment, wherein the liquid metal comprises at least one of liquid gallium or liquid galinstan.

An eighteenth example embodiment provides a circuit assembly according to any of the fourteenth through seventeenth example embodiments, further comprising an elastomeric membrane between the liquid and the integrated circuit, the elastomeric membrane being adapted to resist expansion of the liquid toward the integrated circuit.

A nineteenth example embodiment provides a circuit assembly according to any of the fourteenth through eighteenth example embodiments, wherein:
the liquid, the housing, and the integrated circuit define boundaries of a cavity;
the first operating condition corresponds to a first temperature at which the liquid has the first volume and has a first shape that does not extend into the cavity;
the second operating condition corresponds to a second temperature, greater than the first temperature, at which the liquid has the second volume and has a second shape that extends into the cavity.

A twentieth example embodiment provides a circuit assembly according to the nineteenth example embodiment, wherein the liquid is thermally expandable throughout a range of shapes that include the first and second shapes, the range of shapes further including an intermediate shape in which the liquid extends into the cavity to a lesser extent than in the second operating condition, the intermediate shape occurring at an intermediate temperature between the first and second temperatures.

A twenty-first example embodiment provides a method of manufacturing an electronic apparatus (e.g., electronic device or a circuit assembly thereof), the method comprising:
providing a heatsink that includes a liquid, the heatsink having a first heat transfer coefficient and the liquid having a second heat transfer coefficient greater than the first heat transfer coefficient;
locating the heatsink on an integrated circuit that includes one or more electronic components that operatively generate heat; and
securing the heatsink to the integrated circuit, wherein:
in use, the heatsink operates in at least a first operating condition and a second operating condition, wherein:
in the first operating condition, the liquid has a first volume and a first thermal contact with the integrated circuit; and
in the second operating condition, the liquid has a second volume and the second thermal contact with the integrated circuit, the second volume being greater than the first volume and the second thermal contact being greater than the first thermal contact thereby varying amount of heat dissipated from the one or more electronic components in the second operating condition.

A twenty-second example embodiment provides a heatsink 100 comprising:
a solid housing 110 having a first heat transfer coefficient and at least partially enclosing a cavity 130; and
a body of liquid 120 in thermal communication with the solid housing 110 and adjacent to the cavity 130 when at a first temperature, the body of liquid 120 having a second heat transfer coefficient higher than the first heat transfer coefficient of the solid housing 110, the body of liquid 210 being thermally deformable (e.g., thermally expandable) between a first shape that does not extend into the cavity 130 at the first temperature and a second shape that extends into the cavity 130 at a second temperature higher than the first temperature; and wherein:
when the body of liquid 120 is at the first temperature and has the first shape that does not extend into the cavity 130 in the solid housing 110, the heatsink 100 has a first overall thermal conductivity; and
when the body of liquid 120 is at the second temperature and has the second shape that extends into the cavity 130 in the solid housing 110, the heatsink 100 has a second overall thermal conductivity that is higher than the first overall thermal conductivity.

A twenty-third example embodiment provides a heatsink 100 according to the twenty-second example embodiment, wherein:
the body of liquid 120 includes liquid metal with the second heat transfer coefficient that is higher than the first heat transfer coefficient of the solid housing 110.

A twenty-fourth example embodiment provides a heatsink 100 according to the twenty-third example embodiment, wherein:
the liquid metal includes at least one of liquid gallium or liquid galinstan.

A twenty-fifth example embodiment provides a heatsink 100 according to any of the twenty-second through twenty-fourth example embodiments, further comprising:
an elastomeric membrane between at least a portion of the body of liquid 120 and at least a portion of the cavity 130, the elastomeric membrane 121 being adapted to resist extension of the body of liquid 120 into the cavity 130.

A twenty-sixth example embodiment provides a heatsink 100 according to any of the twenty-second through twenty-fifth example embodiments, wherein:
the solid housing 110 is adapted to be affixed to a solid heat source 101;
when the body of liquid 120 is at the first temperature and has the first shape that does not extend into the cavity 130 of the solid housing 110, the body of liquid 120 does not contact the solid heat source 101 to which the solid housing 110 is affixed; and
when the body of liquid 120 is at the second temperature and has the second shape that extends into the cavity 130 of the solid housing 110, the body of liquid 120 contacts the solid heat source 101 to which the solid housing 110 is affixed.

A twenty-seventh example embodiment provides a heatsink 100 according to any of the twenty-second through twenty-sixth example embodiments, wherein:
the cavity 130 in the solid housing 110 is a thermal expansion cavity (e.g., receptacle) into which at least a portion of the body of liquid 120 extends when at the second temperature; and
the solid housing further includes a reservoir cavity that at least partially encloses the body of liquid 120 in both the first and second shapes and at both the first and second temperatures.

A twenty-eighth example embodiment provides a heatsink 100 according to the twenty-seventh example embodiment, wherein:
the solid housing 110 is adapted to be affixed to a solid heat source 101; and
when the body of liquid 120 is at the second temperature and has the second shape that extends into the thermal expansion cavity 130, at least the portion of the body of liquid 120 extends toward the solid heat source 101 and contacts the solid heat source 101 to which the solid housing 110 is affixed.

A twenty-ninth example embodiment provides a heatsink 100 according to the twenty-seventh example embodiment, wherein:
the solid housing 110 is adapted to be affixed to a solid heat source 101; and
when the body of liquid 120 is at the second temperature and has the second shape that extends into the thermal expansion cavity 130, at least the portion of the body of liquid 120 extends toward the solid heat source 101 to which the solid housing 110 is affixed but does not contact the solid heat source 101.

A thirtieth example embodiment provides a heatsink 100 according to the twenty-ninth example embodiment, further comprising:
an elastomeric membrane 121 between at least a portion of the body of liquid 120 and at least a portion of the thermal expansion cavity 130, the elastomeric membrane 121 being adapted to prevent the body of liquid 120 from contacting the solid heat source 101 to which the solid housing 110 is affixed.

A thirty-first example embodiment provides a heatsink 100 according to any of the twenty-second through thirtieth example embodiments, wherein:
the body of liquid 120 is thermally deformable throughout a range of shapes that includes the first shape that does not extend into the cavity 130 at the first temperature and the second shape that extends into the cavity 130 at the second temperature, the range of shapes further including an intermediate shape that extends into the cavity 130 at an intermediate temperature between the first and second temperatures; and
when the body of liquid 120 is at the intermediate temperature and has the intermediate shape, the heatsink 100 has an intermediate overall thermal conductivity that is between the first and second overall thermal conductivities.

A thirty-first example embodiment provides a circuit assembly comprising:
an integrated circuit; and
a heatsink 100 affixed to the integrated circuit and adapted to receive heat from the integrated circuit, the heatsink 100 including:
a solid housing 110 having a first heat transfer coefficient and at least partially enclosing a cavity 130; and
a body of liquid 120 in thermal communication with the solid housing 110 and adjacent to the cavity 130 when at a first temperature, the body of liquid 120 having a second heat transfer coefficient higher than the first heat transfer coefficient of the solid housing 110, the body of liquid 120 being thermally deformable between a first shape that does not extend into the cavity 130 at the first temperature and a second shape that extends into the cavity 130 at a second temperature higher than the first temperature; and wherein:
when the body of liquid 120 is at the first temperature and has the first shape that does not extend into the cavity 130 in the solid housing 110, the heatsink 100 receives heat from the integrated circuit with a first overall thermal conductivity; and
when the body of liquid 120 is at the second temperature and has the second shape that extends into the cavity 130 in the solid housing 110, the heatsink 100 receives heat from the integrated circuit with a second overall thermal conductivity that is higher than the first overall thermal conductivity.

A thirty-second example embodiment provides a circuit assembly according to the thirty-first example embodiment, wherein:
the body of liquid 120 includes liquid metal that includes at least one of liquid gallium or liquid galinstan.

A thirty-third example embodiment provides a circuit assembly according to the thirty-first example embodiment or the thirty-second example embodiment, wherein:
the cavity 130 in the solid housing 110 of the heatsink 100 is a thermal expansion cavity 130 into which at least a portion of the body of liquid 120 extends when at the second temperature; and
the solid housing 110 of the heatsink 100 further includes a reservoir cavity 130 that at least partially encloses the body of liquid 120 in both the first and second shapes and at both the first and second temperatures.

A thirty-fourth example embodiment provides a circuit assembly according to the thirty-third example embodiment, wherein:
when the body of liquid 120 is at the second temperature and has the second shape that extends into the thermal expansion cavity 130 of the heatsink 100, at least the portion of the body of liquid 120 extends toward the integrated circuit and contacts the integrated circuit.

A thirty-fifth example embodiment provides a circuit assembly according to the thirty-third example embodiment, wherein:
when the body of liquid 120 is at the second temperature and has the second shape that extends into the thermal expansion cavity 130 of the heatsink 100, at least the portion of the body of liquid 120 extends toward the integrated circuit but does not contact the integrated circuit.

A thirty-sixth example embodiment provides a circuit assembly according to any of the thirty-first through thirty-fifth example embodiments, wherein:
the body of liquid 120 is thermally deformable throughout a range of shapes that includes the first shape that does not extend into the cavity 130 at the first temperature and the second shape that extends into the cavity 130 at the second temperature, the range of shapes further including an intermediate shape that extends into the cavity 130 at an intermediate temperature between the first and second temperatures; and
when the body of liquid 120 is at the intermediate temperature and has the intermediate shape, the heatsink 100 receives heat from the integrated circuit with an intermediate overall thermal conductivity that is between the first and second overall thermal conductivities.

A thirty-seventh example embodiment provides a heatsink comprising:

a housing 110 having a first heat transfer coefficient; and
a liquid 120 in thermal communication with the housing 110, the liquid 120 and the housing 110 at least partially defining a cavity 130 adjacent to the liquid 120 when the liquid 120 is at a first temperature, the liquid 120 having a second heat transfer coefficient distinct from (e.g., higher than or lower than) the first heat transfer coefficient of the housing 110, the liquid 120 being thermally deformable between a first shape that does not extend into the cavity 130 at the first temperature and a second shape that extends into the cavity 130 at a second temperature higher than the first temperature;
the heatsink having at least:
a first operating condition when the liquid 120 is at the first temperature and has the first shape that does not extend into the cavity 130, the heatsink in the first operating condition having a first overall thermal conductivity; and
a second operating condition when the liquid 120 is at the second temperature and has the second shape that extends into the cavity 130, the heatsink in the second operating condition having a second overall thermal conductivity that is distinct from (e.g., higher than or lower than) the first overall thermal conductivity.

A thirty-eighth example embodiment provides a heatsink comprising:
a housing 110; and
a liquid 120 in thermal communication with the housing 110, the liquid 120 and the housing 110 at least partially defining a cavity 130 adjacent to the liquid 120 when the liquid 120 is at a first temperature, the liquid 120 being thermally deformable between a first shape that does not extend into the cavity 130 at the first temperature and a second shape that extends into the cavity 130 at a second temperature higher than the first temperature;
the heatsink having at least:
a first operating condition when the liquid 120 is at the first temperature and has the first shape that does not extend into the cavity 130, the heatsink in the first operating condition having a first overall thermal conductivity; and
a second operating condition when the liquid 120 is at the second temperature and has the second shape that extends into the cavity 130, the heatsink in the second operating condition having a second overall thermal conductivity that is distinct from (e.g., higher than or lower than) the first overall thermal conductivity.

What is claimed is:

1. A heatsink comprising:
a housing having a first heat transfer coefficient and in thermally conductive communication with a heat source;
a liquid in thermally conductive communication with the housing and having a second heat transfer coefficient that is greater than the first heat transfer coefficient; and
an elastomeric membrane between the liquid and the heat source, the elastomeric membrane being adapted to resist expansion of the liquid toward the heat source, wherein:
in a first operating condition, the liquid has a first volume that causes no portion of the elastomeric membrane to contact the heat source;
in a second operating condition, the liquid has a second volume that causes a first portion of the elastomeric membrane to contact with the heat source, the second operating condition enhancing dissipation of heat from the heat source relative to the first operating condition; and
in a third operating condition, the liquid has a third volume that causes a second portion of the elastomeric membrane to contact the heat source, the second portion being larger than the first portion, the third operating condition enhancing dissipation of heat from the heat source relative to the second operating condition.

2. The heatsink of claim 1, wherein the liquid comprises liquid metal.

3. The heatsink of claim 2, wherein the liquid metal comprises at least one of liquid gallium or liquid galinstan.

4. The heatsink of claim 1, wherein the second portion of the elastomeric membrane includes the first portion of the elastomeric membrane.

5. The heatsink of claim 1, wherein:
in the first operating condition, the liquid is at a first temperature and has a first shape that does not extend into a cavity at least partially bounded by the liquid and the heat source, no portion of the elastomeric membrane making contact with the heat source;
in the second operating condition, the liquid is at a second temperature, greater than the first temperature, and has a second shape that extends into the cavity and causes the first portion of the elastomeric membrane to make contact with the heat source; and
in the third operating condition, the liquid has a third temperature, greater than the second temperature, and has a third shape that extends into the cavity and causes the second portion of the elastomeric membrane to make contact with the heat source.

6. The heatsink of claim 1, wherein the housing defines a cavity into which the liquid expands in the second and third operating conditions.

7. The heatsink of claim 6, wherein the cavity comprises air.

8. The heatsink of claim 1, wherein:
in the second operating condition, the first portion of the elastomeric membrane contacts the heat source at a first area of contact; and
in the third operating condition, the second portion of the elastomeric membrane contacts the heat source at a second area of contact, the second area of contact being larger than the first area of contact.

9. The heatsink of claim 8, wherein:
the third operating condition enhances dissipation of heat from the heat source relative to the second operating condition based on the first area of contact between the elastomeric membrane and the heat source communicating more heat energy than the second area of contact between the elastomeric membrane and the heat source.

10. The heatsink of claim 1, wherein:
the elastomeric membrane, the housing, and the heat source define boundaries of a cavity;
the first operating condition corresponds to a first temperature at which the liquid has the first volume and has a first shape that does not extend into the cavity;
the second operating condition corresponds to a second temperature, greater than the first temperature, at which the liquid has the second volume and has a second shape that extends into the cavity.

11. The heatsink of claim 10, wherein the liquid is thermally expandable throughout a range of shapes that include the first and second shapes, the range of shapes further including an intermediate shape in which the liquid extends into the cavity to a lesser extent than in the second operating condition, the intermediate shape occurring at an intermediate temperature between the first and second temperatures.

12. The heatsink of claim 10, wherein the housing defines a reservoir that contains a majority portion of the liquid in the first shape that does not extend into the cavity.

13. A circuit assembly comprising:
an integrated circuit; and
a heatsink affixed to the integrated circuit, the heatsink comprising:
  a housing having a first heat transfer coefficient and in thermally conductive communication with the integrated circuit;
  a liquid in thermally conductive communication with the housing and having a second heat transfer coefficient that is greater than the first heat transfer coefficient; and
  an elastomeric membrane between the liquid and the integrated circuit, the elastomeric membrane being adapted to resist expansion of the liquid toward the integrated circuit, wherein:
  in a first operating condition, the liquid has a first volume that causes no portion of the elastomeric membrane to contact the integrated circuit;
  in a second operating condition, the liquid has a second volume that causes a first portion of the elastomeric membrane to contact the integrated circuit, the second operating condition enhancing dissipation of heat from the integrated circuit relative to the first operating condition; and
  in a third operating condition, the liquid has a third volume that causes a second portion of the elastomeric membrane to contact the integrated circuit, the second portion being larger than the first portion, the third operating condition enhancing dissipation of heat from the integrated circuit relative to the second operating condition.

14. The circuit assembly of claim 13, wherein the liquid has a first temperature in the first operating condition and the liquid has a second temperature in the second operating condition.

15. The circuit assembly of claim 13, wherein the liquid comprises liquid metal.

16. The circuit assembly of claim 15, wherein the liquid metal comprises at least one of liquid gallium or liquid galinstan.

17. The circuit assembly of claim 13, wherein the second portion of the elastomeric membrane includes the first portion of the elastomeric membrane.

18. The circuit assembly of claim 13, wherein:
the elastomeric membrane, the housing, and the integrated circuit define boundaries of a cavity;
the first operating condition corresponds to a first temperature at which the liquid has the first volume and has a first shape that does not extend into the cavity;
the second operating condition corresponds to a second temperature, greater than the first temperature, at which the liquid has the second volume and has a second shape that extends into the cavity.

19. The circuit assembly of claim 18, wherein the liquid is thermally expandable throughout a range of shapes that include the first and second shapes, the range of shapes further including an intermediate shape in which the liquid extends into the cavity to a lesser extent than in the second operating condition, the intermediate shape occurring at an intermediate temperature between the first and second temperatures.

20. A method of manufacturing an electronic apparatus, the method comprising:
providing a heatsink that includes a liquid restrained by an elastomeric membrane, the heatsink having a first heat transfer coefficient and the liquid having a second heat transfer coefficient greater than the first heat transfer coefficient;
locating the heatsink on an integrated circuit that includes one or more electronic components that operatively generate heat; and
securing the heatsink to the integrated circuit, wherein:
  in use, the heatsink operates in at least a first operating condition, a second operating condition, and a third operating condition, wherein:
    in the first operating condition, the liquid has a first volume that causes no portion of the elastomeric membrane to contact the integrated circuit;
    in the second operating condition, the liquid has a second volume that causes a first portion of the elastomeric membrane to contact the integrated circuit, the second operating condition enhancing heat dissipation from the one or more electronic components relative to the first operating condition; and
    in the third operating condition, the liquid has a third volume that causes a second portion of the elastomeric membrane to contact the integrated circuit, the second portion being larger than the first portion, the third operating condition enhancing heat dissipation from the one or more electronic components relative to the second operating condition.

* * * * *